(12) United States Patent
Morikawa

(10) Patent No.: US 10,797,130 B2
(45) Date of Patent: Oct. 6, 2020

(54) SEMICONDUCTOR DEVICE

(71) Applicant: SANKEN ELECTRIC CO., LTD., Niiza-shi, Saitama (JP)

(72) Inventor: Naoki Morikawa, Miyoshi-town (JP)

(73) Assignee: SANKEN ELECTRIC CO., LTD., Niiza-shi (JP)

( * ) Notice: Subject to any disclaimer, the term of this patent is extended or adjusted under 35 U.S.C. 154(b) by 0 days.

(21) Appl. No.: 16/260,321

(22) Filed: Jan. 29, 2019

(65) Prior Publication Data
US 2020/0168704 A1  May 28, 2020

(30) Foreign Application Priority Data
Nov. 22, 2018 (JP) .................. 2018-219023

(51) Int. Cl.
*H01L 29/06* (2006.01)
*H01L 29/739* (2006.01)
*H01L 29/10* (2006.01)
*H01L 29/417* (2006.01)

(52) U.S. Cl.
CPC ...... *H01L 29/0696* (2013.01); *H01L 29/0638* (2013.01); *H01L 29/1004* (2013.01); *H01L 29/1095* (2013.01); *H01L 29/41708* (2013.01); *H01L 29/7395* (2013.01)

(58) Field of Classification Search
CPC ..... H01L 51/56; H01L 33/62; H01L 51/0072; H01L 51/5012; H01L 51/5056

USPC ........................................ 257/655
See application file for complete search history.

(56) References Cited

U.S. PATENT DOCUMENTS

2007/0052014 A1* 3/2007 Takahashi ........... H01L 29/0696
257/330

FOREIGN PATENT DOCUMENTS

JP       2007-059766 A     3/2007

* cited by examiner

*Primary Examiner* — Andy Huynh
(74) *Attorney, Agent, or Firm* — Metrolex IP Law Group, PLLC

(57) ABSTRACT

A semiconductor device is disclosed that includes a substrate; a first semiconductor region arranged in the cell region on a first surface side of the substrate; a second semiconductor region arranged in a cell region; a channel stopper electrode arranged in a termination region; a first electrode arranged on the first surface and electrically connected to the second semiconductor region; an insulation film arranged between the channel stopper electrode and the first electrode; first conductors arranged inside the insulation film; second conductors arranged on the insulation film; and a second electrode arranged on a second surface side of the substrate. A width of an overlapping portion in a height direction of the first conductor and the second conductor on the first electrode side is larger than a width of an overlapping portion in the height direction of the first and second conductors on the channel stopper electrode side.

14 Claims, 6 Drawing Sheets

SEMICONDUCTOR DEVICE

CROSS REFERENCE TO RELATED APPLICATIONS

This application claims priority based on 35 USC 119 from prior Japanese Patent Application No. 2018-219023 filed on Nov. 22, 2018, entitled "SEMICONDUCTOR DEVICE", the entire contents of which are incorporated herein by reference.

BACKGROUND

The disclosure relates to a semiconductor device, or more specifically, to a semiconductor device designed to improve reliability.

FIG. 1 of Japanese Patent Application Publication No. 2007-59766 (Patent Document 1) discloses an insulated gate bipolar transistor (IGBT) which includes trenches 7 formed in a peripheral portion 6 and achieves high withstand voltage. Here, second trench conductors 27 are coupled to one another by using capacitive coupling conductor layers 29, and electric potentials of the second trench conductors 27 vary by changing positions and sizes of the capacitive coupling conductor layers 29. Since the capacitive coupling conductor layers 29 that are adjustable in size and in position are provided, it is possible to obtain an ideal depletion layer and ideal electric field distribution to improve the withstand voltage, which allegedly facilitate design and manufacturing of the IGBT (paragraph 0043 in Patent Document 1).

SUMMARY

A semiconductor device according to one or more embodiments including a cell region and a termination region arranged around the cell region comprises: a substrate; a first semiconductor region of a first conductivity type arranged in the cell region on a first surface side of the substrate; a second semiconductor region of a second conductivity type arranged in the cell region on the first surface side of the substrate; a channel stopper electrode arranged in the termination region on the first surface side of the substrate; a first electrode arranged on the first surface side of the substrate and electrically connected to the second semiconductor region; an insulation film arranged between the channel stopper electrode and the first electrode in the termination region of the substrate; first conductors arranged inside the insulation film; second conductors arranged on the insulation film; and a second electrode arranged on a second surface side of the substrate, in which a width of an overlapping portion in a height direction of one of the first conductors and one of the second conductor on the first electrode side is larger than a width of an overlapping portion in the height direction of one of the first conductors and the second conductor on the channel stopper electrode side.

DETAILED DESCRIPTION

Figure 1:
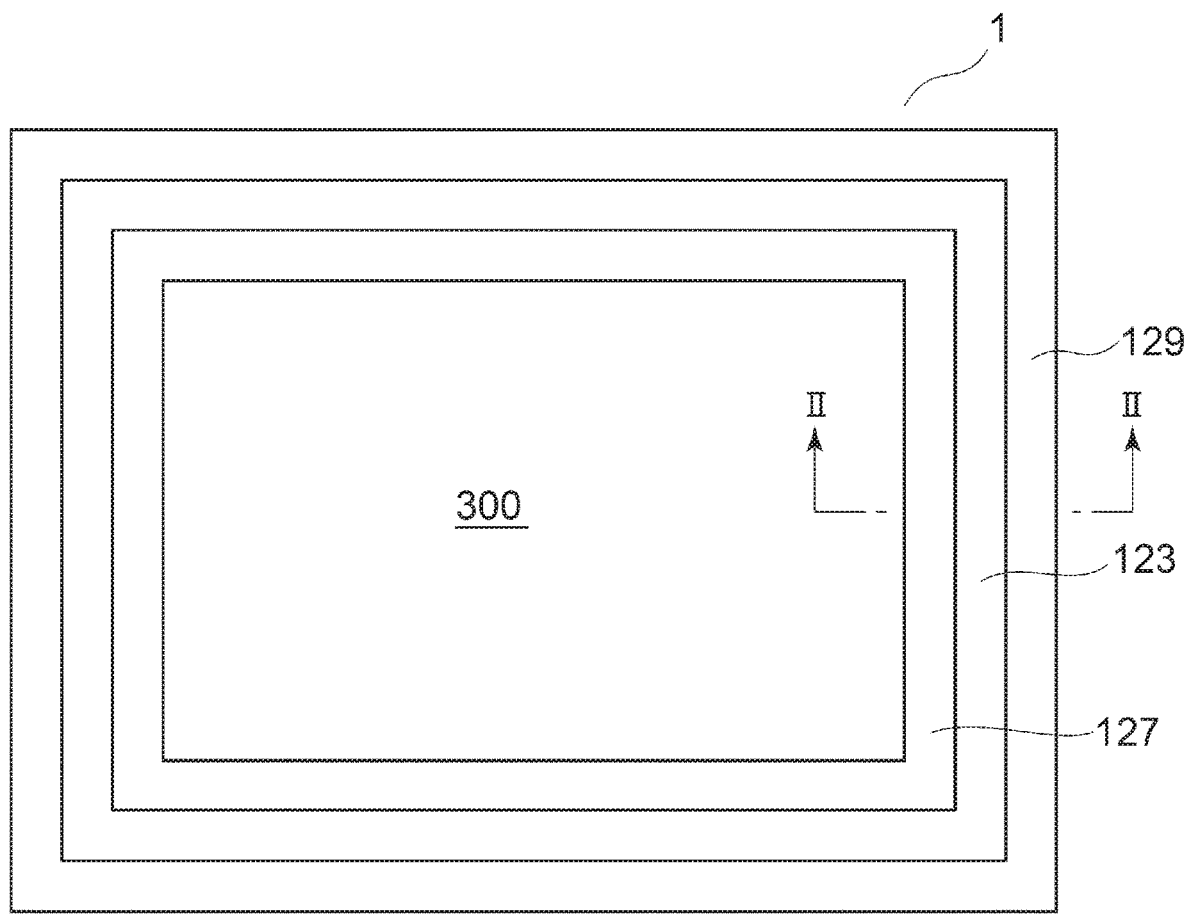
FIG. 1 is a diagram illustrating a plan view of a semiconductor device according to one or more embodiments.

One or more embodiments are explained below in detail with reference to drawings. In the following description of the drawings, identical or similar elements may be denoted by identical or similar reference numbers. It is to be noted, however, that the drawings are merely schematic and thickness and dimensional relations, thickness ratios among layers, and the like are just examples and are not intended to limit the technical ideas of this disclosure. In addition, dimensional relations and ratios may also vary among the drawings. While the following embodiment describes an example in which a first conductivity type represents an n-type while a second conductivity type represents a p-type, there is also a case in which the first conductivity type may be the p-type while the second conductivity type may be the n-type by selecting an inverted conductivity-type relation. In the following description, expressions an "upper side", a "lower side", a "right side", a "left side", and the like may be used as appropriate based on the drawings to be referred to. However, these expressions are not intended to limit the technical ideas of the disclosure. Meanwhile, the x axis and the y axis indicated in the drawings may be used to describe directions. Here, regarding cross-sectional views in particular, a "lateral direction" or a "longitudinal direction" may represent directions opposite to the x direction or the y direction indicated in the drawings. In the meantime, a "depth direction" may represent the y direction indicated in the drawings while a "height direction" may represent the opposite direction to the y direction.

FIG. 1 is a diagram illustrating a plan view of a semiconductor device according to one or more embodiments. This semiconductor device includes a cell region (an active region) 300 arranged at the center, an emitter electrode 127 arranged on the cell region 300 while extending outward therefrom, a first interlayer insulation film 123 arranged on an outer peripheral portion of the emitter electrode 127, and a channel stopper electrode 129 arranged on an outer peripheral portion of the first interlayer insulation film 123. Here, the cell region 300 may include a principal part of an insulated gate bipolar transistor (IGBT), for example. However, without limitation to the foregoing, the cell region 300 may also be realized in the form of any of a diode, a Schottky barrier diode (SBD), a metal-oxide-semiconductor field-effect transistor (MOSFET), and the like. The first interlayer insulation film 123 and the channel stopper electrode 129 are arranged in such a way as to surround the cell region 300. A structure including a portion of the emitter electrode 127, the first interlayer insulation film 123, and the channel stopper electrode 129 arranged on and extending outward from the cell region 300 may also be referred to as a termination region as appropriate. In the embodiment of FIG. 1, the cell region 300 has a rectangular shape. However, without limitation to the foregoing, the cell region 300 may also be realized in any of a square shape, a circular shape, an oval shape, and the like. Meanwhile, each of four corners of the rectangle of the termination region is formed into a right angle in the embodiment of FIG. 1. However, without limitation to the foregoing, each corner may be formed into a rounded shape such as a quarter circle. Note that FIG. 1 does not indicate a protection film (not illustrated) for the convenience of explanation. However, such a protection film may be arranged in such a way as to cover at least part of the cell region 300 as well as the termination region.

Figure 2:
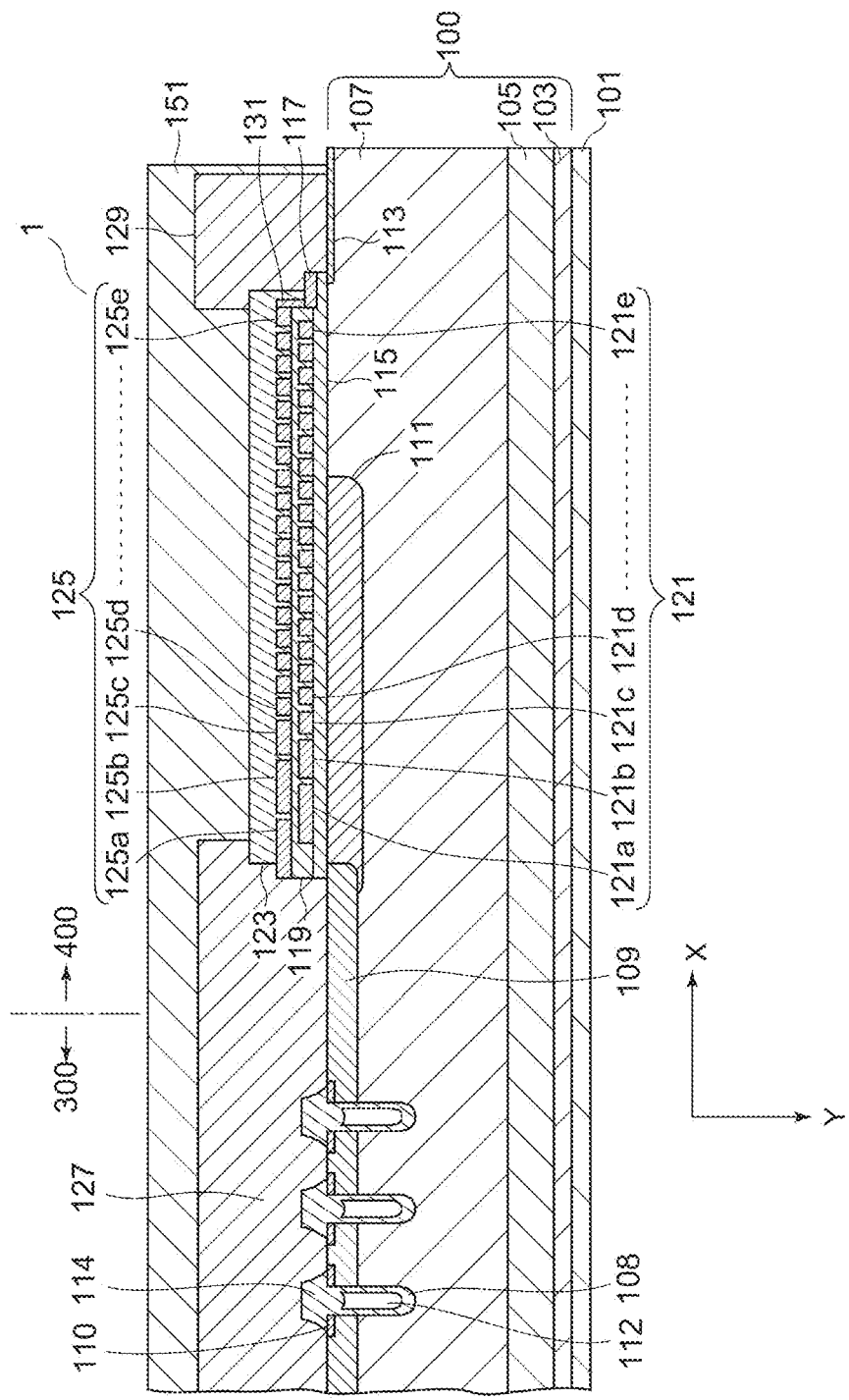
FIG. 2 is a diagram illustrating a cross-sectional view of a semiconductor device 1 according to one or more embodiments.

FIG. 2 is a diagram illustrating a cross-sectional view of a semiconductor device 1 according to one or more embodiments, which is taken along the H-H line in FIG. 1. This cross-sectional view illustrates cross-sectional portions of the cell region 300 and a termination region 400 of the IGBT. In comparison with FIG. 1, the embodiment of FIG. 2 represents a structure in which part of the emitter electrode 127, the first interlayer insulation film 123, and the channel stopper electrode 129 are covered with a protection film 151. The semiconductor device 1 illustrated in FIG. 2 includes: a collector electrode 101 arranged on a second surface side of a substrate 100; a collector layer 103 of the second conductivity type arranged on the collector electrode 101 in the substrate 100; a field stop layer 105 of the first conductivity type arranged on the collector layer 103; a drift layer 107 of the first conductivity type arranged on the field stop layer 105 and having a lower impurity concentration than that of the field stop layer 105; a base region 109 of the second conductivity type provided on the drift layer 107 and on the cell region 300 side; a reduced surface layer 111 of the second conductivity type arranged on the drift layer 107 and on an end portion side (the termination region 400) of the substrate 100 in such a way as to come into contact with the base region 109, and having a lower impurity concentration than that of the base region 109; and a channel stopper region 113 of the first conductivity type provided on the drift layer 107 and on the end portion side (the termination region 400) of the substrate 100. Here, a combination of the collector layer 103, the field stop layer 105, the drift layer 107, the base region 109, the reduced surface layer 111, and the channel stopper region 113 mentioned above may be simply and conceptually referred to as the substrate 100. The cell region 300 includes grooves that penetrate the base region 109 and reach the drift layer 107, gate electrodes 112 arranged inside the grooves by the intermediary of insulation films 108, and emitter regions 110 of the first conductivity type provided on the base region 109 adjacent to the grooves. Meanwhile, the termination region 400 of the semiconductor device 1 between the emitter electrode 127 and the channel stopper electrode 129 includes: a first insulation film 115 arranged on the base region 109, the reduced surface layer 111, the channel stopper region 113, and on a portion of the drift layer 107 between the reduced surface layer 111 and the channel stopper region 113; a first conductor group 121 including first conductors 121a, 121b, 121c, 121d, and 121e arranged on the first insulation film 115 and separated from one another; a second insulation film 119 arranged in such a way as to cover the first conductor group 121; a second conductor group 125 including second conductors 125a, 125b, 125c, 125d, and 125e arranged on the second insulation film 119 and separated from one another; a line 131 electrically connected to the second conductor 125e on the channel stopper electrode 129 side; the first interlayer insulation film 123 arranged in such a way as to cover part of the second conductor 125a as well as the second conductors 125b, 125c, 125d, and the like; the emitter electrode 127 provided on the base region 109 in such a way as to come into contact with the second conductor 125a on the emitter electrode 127 side; a line 117 electrically connected to the line 131; the channel stopper electrode 129 provided in such a way as to come into contact with the line 117 and the channel stopper region 113; and the protection film 151 provided in such a way as to cover the first interlayer insulation film 123 and the channel stopper electrode 129 as well as at least part of the emitter electrode 127.

The collector electrode 101 is electrically connected to the collector layer 103. The emitter electrode 127 is electrically connected to either the emitter regions 110 or both the emitter regions 110 and the base region 109. The first interlayer insulation film 123 may adopt non-doped silicate glass (NSG), boron phosphor silicate glass (BPSG), or a combination thereof.

Dimensions (widths) in the longitudinal direction (the x direction) of the first conductors 121a, 121b, 121c, and 121d may be gradually reduced from the cell region 300 side toward the end portion side of the semiconductor device 1 while widths of the first semiconductors 121e may be set equal to one another. Alternatively, the widths of the first conductors may be gradually reduced in the order of the second, third, fourth, fifth, sixth seventh, eighth, and ninth conductors, and the like counted from the cell region 300 side, for instance, and the widths of the first semiconductors thereafter may be set equal. Moreover, when viewed from above (viewed in the y direction), dimensions in the longitudinal direction of the first conductors 121a, 121b, 121c, and the like on the cell region side from a section above an end portion of the reduced surface layer 111 on the end portion side of the semiconductor device 1 may be gradually reduced from the cell region 300 side to the end portion side of the reduced surface layer 111, and dimensions in the longitudinal direction of the conductors in the second conductor group 125 thereafter, or in other words, from the section above the end portion side of the reduced surface layer 111 to the end portion side of the semiconductor device 1 therefrom may be set equal to one another. The dimension in the longitudinal direction (the x direction) of the first conductor 121a is set preferably in a range from about 19 to about 35 µm, or more preferably in a range from about 19 to about 30 µm, or even more preferably around 27 µm. The dimension in the longitudinal direction (the x direction) of the first conductor 121b is set preferably in a range from about 14 to about 30 µm, or more preferably in a range from about 14 to about 25 µm, or even more preferably around 22 µm. The dimension in the longitudinal direction (the x direction) of the first conductor 121c is set preferably in a range from about 4 to about 20 µm, or more preferably in a range from about 4 to about 18 µm, or even more preferably around 12 µm. Here, the first conductor group 121 may include polycrystalline silicon of the first conductivity type. When polycrystalline silicon of the first conductivity type is used for the first conductor group 121, an impurity concentration thereof may be set in a range from $1\times10^{17}$ to $1\times10^{19}$ [/cm$^{-3}$]. The impurity concentrations among the conductors in the first conductor group 121 may be set either equal to one another or different from one another.

Here, dimensions (widths) in the longitudinal direction (the x direction) of the second conductors 125a, 125b, 125c, and 125d may be gradually reduced from the cell region 300 side toward the end portion side. Alternatively, the widths in the longitudinal direction (the x direction) of the conductors in the second conductor group 125 may be gradually reduced in the order of the second, third, fourth, fifth, sixth seventh, eighth, and ninth conductors, and the like counted from the cell region 300 side, for instance, and the widths in the x direction of the conductors in the second conductor group 125 thereafter (in the direction away from the cell region 300) may be set equal to one another. Moreover, when viewed in the y direction, dimensions in the longitudinal direction of the second conductors 125a, 125b, 125c, and the like arranged on the inside of the end portion of the reduced surface layer 111 (the cell region 300 side) may be gradually reduced from the cell region 300 side to the end portion side of the reduced surface layer 111, and dimensions in the longitudinal direction of the conductors in the second conductor group 125 thereafter, or in other words, from the section on the end portion side of the reduced surface layer 111 to the end portion side of the substrate viewed in the y direction may be set equal to one another.

The dimension in the longitudinal direction (the x direction) of the second conductor 125a is set preferably in a range from about 36 to about 56 µm or more preferably around 46 µm. The dimension in the longitudinal direction (the x direction) of the second conductor 125b is set preferably in a range from about 17 to about 37 µm or more preferably around 27 µm. The dimension in the longitudinal direction (the x direction) of the second conductor 125c is set preferably in a range from about 7 to about 27 µm or more preferably around 17 µm. Here, the second conductor group 125 may be made of polycrystalline silicon of the first conductivity type.

Here, the first conductor group 121 may use one of various conductors such as metals. Alternatively, by forming the first conductor group 121 using p-type polycrystalline silicon, it is possible to prevent external ions such as sodium ions from penetrating a portion between the first conductor group 121 and the substrate 100. An impurity in the p-type polycrystalline silicon may be either boron (B) or aluminum (Al), and an impurity concentration thereof is set preferably in a range from about $1\times10^{17}/cm^{-3}$ to about $1\times10^{19}/cm^{-3}$ or more preferably in a range from about $5\times10^{17}/cm^{-3}$ to about $1\times10^{18}/cm^{-3}$. The impurity concentrations among the conductors in the first conductor group 121 may be set either equal to one another or different from one another.

In the meantime, the second conductor group 125 may use one of various conductors such as metals. Alternatively, the second conductor group 125 may include n-type polycrystalline silicon. By forming the second conductor group 125 using the n-type polycrystalline silicon, it is possible to prevent external ions such as sodium ions from penetrating into the semiconductor device 1 beyond the second conductor group 125. An impurity in the n-type polycrystalline silicon may be either phosphorus (P) or arsenic (As), and an impurity concentration thereof is set preferably in a range from about $1\times10^{19}/cm^{-3}$ to about $1\times10^{21}/cm^{-3}$ or more preferably in a range from about $5\times10^{19}/cm^{-3}$ to about $1\times10^{20}/cm^{-3}$. The impurity concentrations among the conductors in the second conductor group 125 may be set either equal to one another or different from one another. In the embodiment, the second conductor 125a is electrically connected to the emitter electrode 127. The second conductor 125a has a higher impurity concentration than that of the first conductor 121a, and can thus improve ohmic properties of the second conductor 125a and the emitter electrode 127. Moreover, by setting the impurity concentration of the first conductor group 121 approximately equal to the impurity concentration of the base region 109 and setting the impurity concentration of the second conductor group 125 approximately equal to the impurity concentration of the emitter regions 110, it is possible to form each of the conductor units and the corresponding region at the same time, and thus to reduce manufacturing costs. Moreover, reliability can be easily improved by connecting the emitter electrode 127 to the second conductor 125a located above the first conductor 121a.

Figure 3:
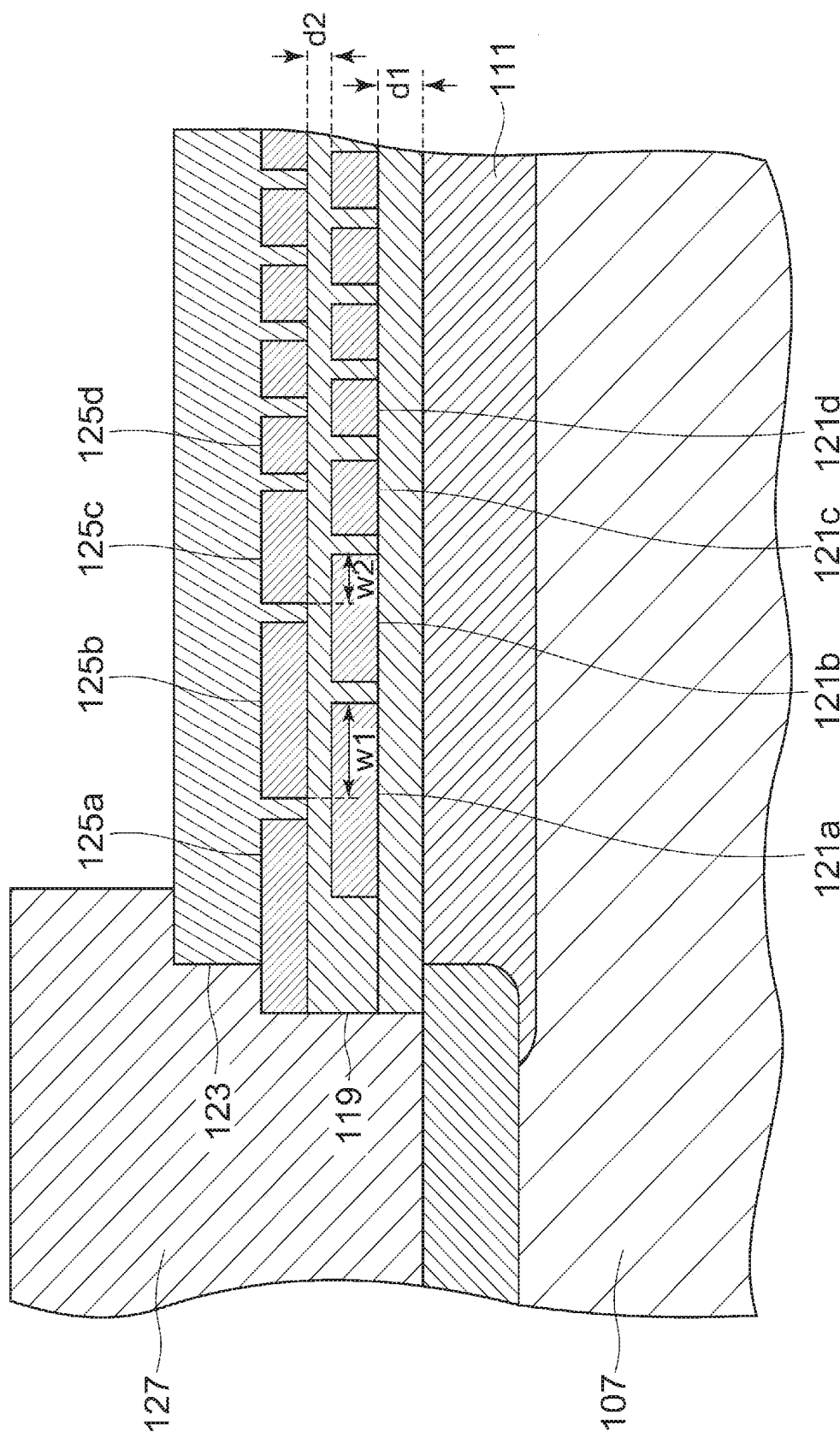
FIG. 3 is a diagram illustrating a cross-sectional view of an enlarged part of FIG. 2.

FIG. 3 is a diagram illustrating a cross-sectional view of an enlarged part of FIG. 2. A thickness d1 of the first insulation film 115 between the first conductor group 121 and the substrate 100 is preferably larger than a thickness d2 of the second insulation film 119 between the first conductor group 121 and the second conductor group 125. Penetration of foreign substances from the outside into the substrate 100 can be prevented by setting a distance between the first conductor group 121 and the second conductor group 125 smaller than a distance between the first conductor group 121 and the substrate 100. Here, the foreign substances from the outside include external ions such as sodium ions. For example, sodium ions contained in rainwater and the like may penetrate into the semiconductor device 1. In this case, however, it is possible to reduce the penetration of the sodium ions from the outside into a space between the substrate 100 and the first conductor group 121 by reducing the distance between the first conductor group 121 and the second conductor group 125.

In the meantime, a width of an overlapping portion (the width being in the orthogonal direction to the y direction in FIG. 2), by which a conductor in the first conductor group 121 is overlapped by a conductor in the second conductor group 125, in a height direction thereof, on the emitter electrode 127 side is preferably set larger than a width of an overlapping portion by which the conductor in the first conductor group 121 is overlapped by another conductor in the second conductor group 125, in a height direction thereof, on the channel stopper electrode 129 side. As a specific example, the overlapping portions, in the height direction, by which the conductors in the first conductor group 121 are overlapped by the conductors in the second conductor group 125 are described by using FIG. 3. The width of the overlapping portion, in the height direction by which the first conductor 121a is overlapped by the second conductor 125b is indicated with w1. Meanwhile, the width of the overlapping portion, in the height direction by which the first conductor 121b is overlapped by the second conductor 125c is indicated with w2. On the reduced surface layer 111, the width (w1) of the overlapping portion by which the first conductor 121a is overlapped by the second conductor 125b on the emitter electrode 127 side is larger than the width (w2) of the overlapping portion by which the first conductor 121b is overlapped by the second conductor 125c. In the meantime, the width (w2) of the overlapping portion of the first conductor 121b and the second conductor 125c is larger than a width of an overlapping portion of the first conductor 121c and the second conductor 125d. By increasing the width of the overlapping portion, in the height direction, on the emitter electrode 127 side as described above, it is possible to reduce the penetration of foreign substances from the outside into the substrate 100. Here, the foreign substances that penetrate from the outside include external ions such as sodium ions.

In this instance, dimensions in the lateral direction (the x direction) of the conductors in the first conductor group 121 and in second conductor group 125 close to the cell region 300 may be set larger while dimensions of the conductors in the first conductor group 121 and in the second conductor group 125 far from the cell region 300, namely, dimensions of the conductors in the first conductor group 121 and in the second conductor group 125 close to the end portion side may be set shorter. In this case, it is possible to equalize intervals between the adjacent conductors in the first conductor group 121. In addition, it is possible to equalize intervals between the adjacent conductors in the second conductor group 125.

Meanwhile, in at least part of a region between the emitter electrode 127 and the channel stopper electrode 129, the width of the overlapping portion in the height direction of a certain first conductor in the first conductor group 121 and a certain second conductor in the second conductor group 125 may be equal to the width of the overlapping portion in the height direction of the certain first conductor in the first conductor group 121 and another second conductor in the second conductor group 125 next to the certain second conductor. Alternatively, in at least part of the region between the emitter electrode 127 and the channel stopper electrode 129, the width of the overlapping portion in the height direction of a certain first conductor in the first conductor group 121 and a certain second conductor in the second conductor group 125 may be equal to the width of the overlapping portion in the height direction of another first conductor in the first conductor group 121 next to the certain first conductor and the certain second conductor in the second conductor group 125. In other words, there may be partially a place where the widths of the overlapping portions remain equal from the emitter electrode 127 side to the channel stopper electrode 129 side.

For example, at the section above the reduced surface layer 111, the width of the overlapping portion in the height direction of the conductor in the first conductor group 121 and the conductor in the second conductor group 125 close to the cell region 300 may be increased and then the widths of the overlapping portions may be gradually reduced in the direction away from the cell region 300. In addition, the widths of the overlapping portions closer to the end portion side of the substrate than the section above the reduced surface layer 111 may be set equal to one another.

Here, the overlapping portion in the depth direction of the conductor in the first conductor group 121 and the conductor in the second conductor group 125 close to the cell region 300 is set preferably in a range from about 8 to about 16 µm, more preferably in a range from 10 to 14 µm, or even more preferably around 12 µm, for example. On the other hand, the overlapping portion in the height direction of the conductor the first conductor group 121 and the conductor in the second conductor group 125 far from the cell region 300 is set preferably in a range from about 1 to about 3 µm or more preferably around 3 µm, for example. As described above, it is possible to reduce the penetration of the foreign substances from the outside into the substrate 100 by setting the overlapping portion in the height direction of the conductor in the first conductor group 121 and the conductor in the second conductor group 125 close to the cell region 300 larger than the overlapping portion in the height direction of the conductor in the first conductor group 121 and the conductor in the second conductor group 125 close to the end portion of the substrate.

Figure 4:
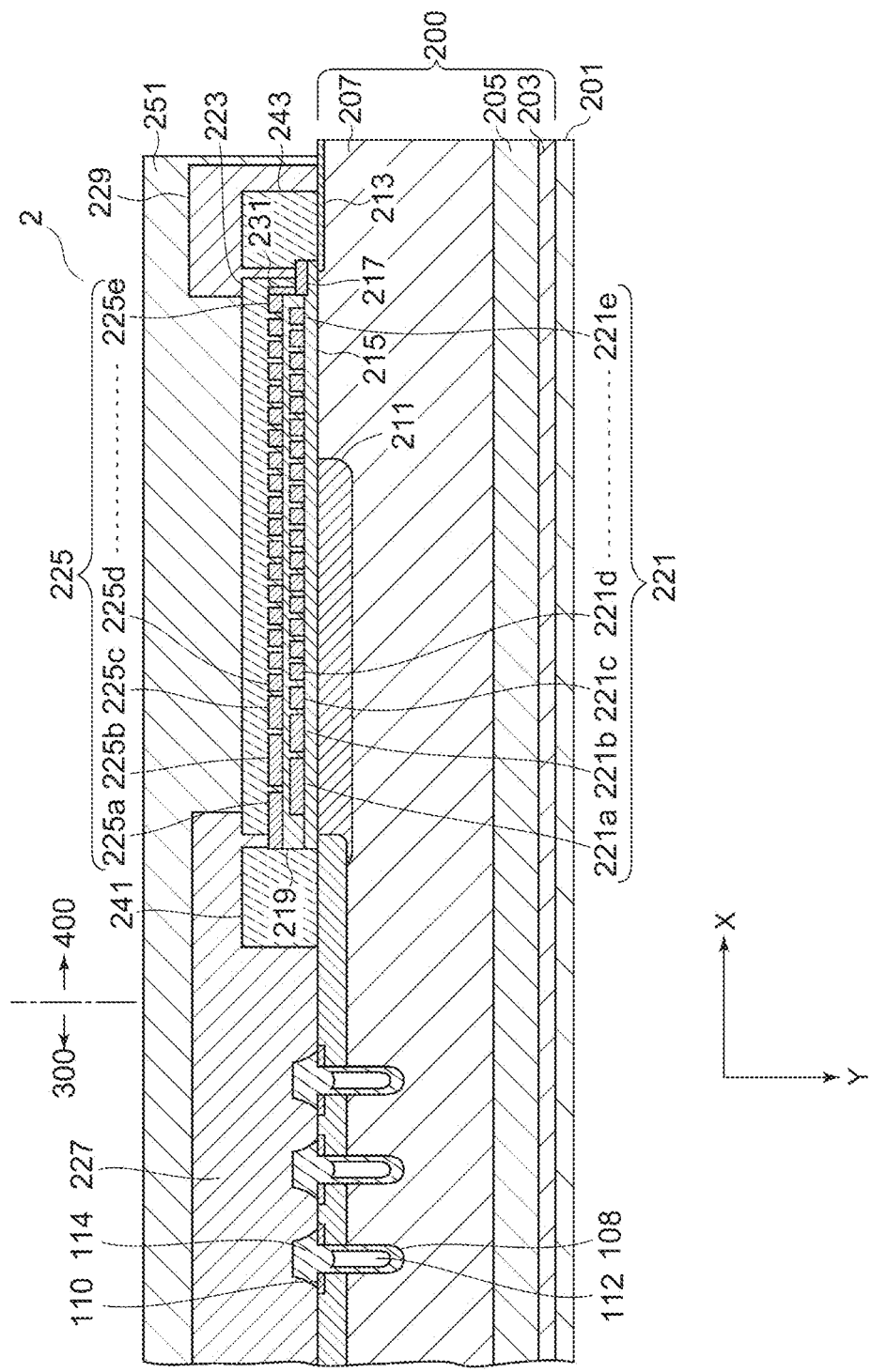
FIG. 4 is a diagram illustrating a cross-sectional view of a semiconductor device 2 according to one or more embodiments.

FIG. 4 is a diagram illustrating a cross-sectional view of a semiconductor device 2 according to one or more embodiments, which is taken along the II-II line in FIG. 1. This cross-sectional view illustrates a cross-sectional portion of the termination region 400 in particular. In comparison with FIG. 1, the embodiment of FIG. 4 illustrates a structure in which an emitter electrode 227, a first interlayer insulation film 223, and a channel stopper electrode 229 are covered with a protection film 251. The termination region 400 of the semiconductor device 2 illustrated in FIG. 4 includes: a collector electrode 201; a collector layer 203 arranged on the collector electrode 201; a field stop layer 205 arranged on the collector layer 203; a field stop layer 205 arranged on the collector layer 203; a drift layer 207 arranged on the field stop layer 205; a base region 209 provided on the drift layer 207 and on the cell region 300 side; a reduced surface layer 211 arranged on the drift layer 207 in such a way as to come into contact with the base region 209; and a channel stopper region 213 provided on the drift layer 207 and on the end portion side. A combination of the collector layer 203, the field stop layer 205, the drift layer 207, the base region 209, the reduced surface layer 211, and the channel stopper region 213 mentioned above may be simply and conceptually referred to as a substrate 200. Moreover, the semiconductor device 2 includes: a first insulation film 215 arranged in such a way as to come into contact with the base region 209, the reduced surface layer 211, the drift layer 207, and the channel stopper region 213; a first conductor group 221 including first conductors 221a, 221b, 221c, 221d, and 221e arranged on the first insulation film 215; a second insulation film 219 arranged in such a way as to cover the first conductor group 221; a second conductor group 225 including second conductors 225a, 225b, 225c, 225d, and 225e arranged on the second insulation film 219; a line 231 electrically connected to the second conductor 225e; a line 217 electrically connected to the line 231; the first interlayer insulation film 223 arranged in such a way as to cover part of the second conductor 225a as well as the second conductors 225b, 225c, 225d, and the like; a second interlayer insulation film 243 arranged on the channel stopper region 213 in such as way as to come into contact with the line 217 and the first insulation film 215; the channel stopper electrode 229 arranged on the channel stopper region 213 in such a way as to cover the second interlayer insulation film 243 and to come into contact with the line 217; a third interlayer insulation film 241 arranged on the base region 209; the emitter electrode 227 arranged on the base region 209 and electrically connected to the second conductor 225a; and the protection film 251 provided in such a way as to cover the emitter electrode 227, the first interlayer insulation film 223, and the channel stopper electrode 229. The cell region 300 in FIG. 4 is the same as the cell region 300 in FIG. 1, and the explanation thereof is omitted herein.

Here, the semiconductor device 2 illustrated in FIG. 4 includes the second interlayer insulation film 243, and the channel stopper electrode 229 establishes electrical connection between a junction to the channel stopper region 213 and the line 217 that is electrically connected to the second conductor 225e in such a way as to detour above the second interlayer insulation film 243. Here, the channel stopper electrode 229 may establish the electrical connection in such a way as to establish physical contact with the line 217 through another line between the first interlayer insulation film 223 and the second interlayer insulation film 243, such that the line 217 and the channel stopper region 213 are separated from each other by the second interlayer insulation film 243 so as to avoid physical contact therebetween. In the meantime, the channel stopper electrode 229 is allowed to extend in the opposite direction (the cell side) to the x direction and is electrically connected to the second conductor 225e. This configuration can inhibit sodium ions and the like from moving closer to the channel stopper region 213 and affecting an electric potential on a surface of the substrate 200. Here, an end in the opposite direction to the x direction of the second conductor 225e may extend closer to the cell region 300 side than an end in the opposite direction to the x direction of the channel stopper electrode 229 does. When the channel stopper electrode 229 is made of a metal, it is possible to suppress a variation in location of the semiconductor device 2 causing electric field concentration. Meanwhile, the semiconductor device 2 illustrated in FIG. 4 includes the third interlayer insulation film 241, and the emitter electrode 227 is electrically connected to the second conductor 225a in such a way as to bypass the third interlayer insulation film 241. Here, the emitter electrode 227 may establish the electrical connection in such a way as to establish physical contact with the second conductor 225a through another line between the first interlayer insulation film 223 and the third interlayer insulation film 241. This configuration can inhibit sodium ions and the like from moving closer to a contact point between the emitter electrode 227 and the third interlayer insulation film 241 near the base region 209 and affecting the electric potential on the surface of the substrate 200. Here, an end in the x direction of the emitter electrode 227 may extend closer to the cell region 300 side than an end in the x direction of the second conductor 225a does. When the channel stopper electrode 229 is made of a metal, it is possible to suppress the variation in location of the semiconductor device 2 causing the electric field concentration.

Figure 5:
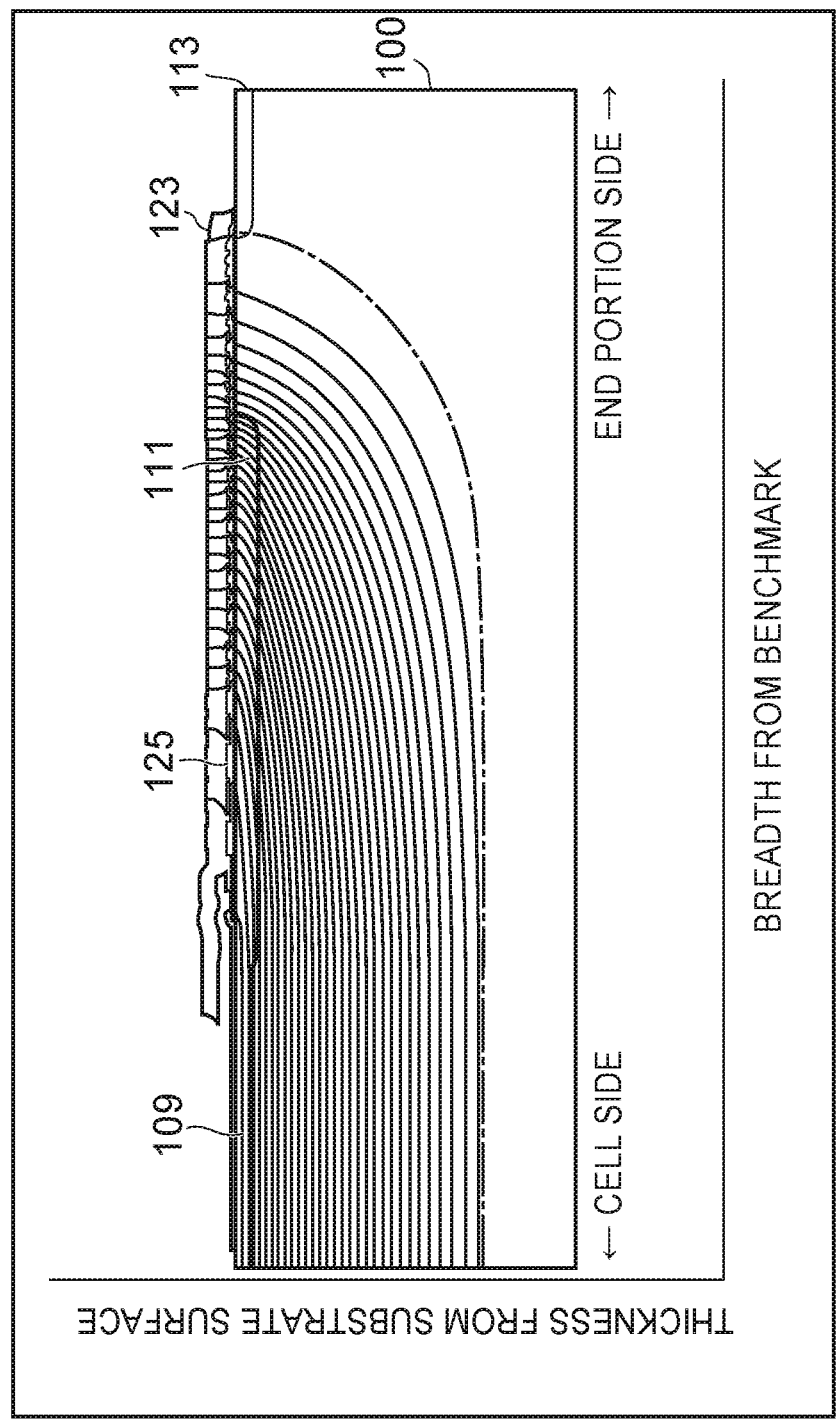
FIG. 5 is a diagram illustrating electric potential distribution in a termination region.

FIG. 5 is a diagram illustrating electric potential distribution in the termination region. Here, the horizontal axis indicates a breadth from a benchmark while the vertical axis indicates a thickness from the substrate surface. It is apparent that the electric potentials vary gently as the dimensions of the first conductor and the second conductor on the cell side (the left side in FIG. 5) in the termination region are longer than the dimensions of the first conductor and the second conductor on the end portion side of the substrate. In other words, it is apparent that sodium ions are less likely to gather on the cell side in the termination region.

Figure 6:
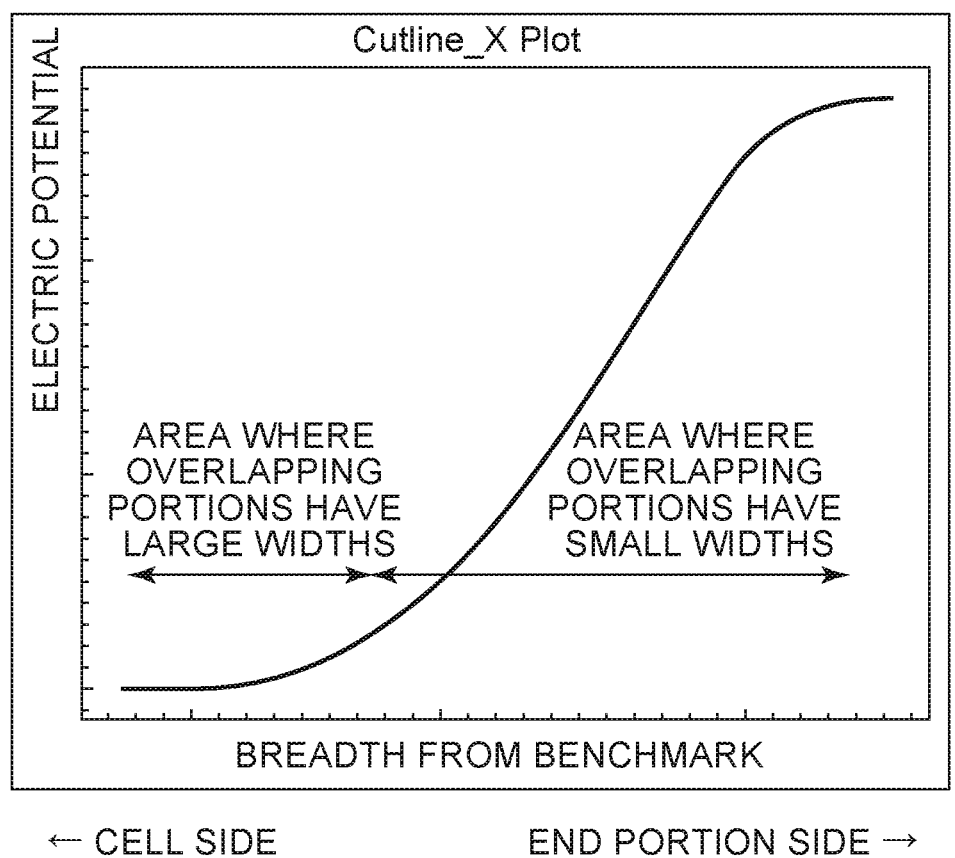
FIG. 6 is another diagram illustrating the electric potential distribution in the termination region.

FIG. 6 is a diagram illustrating the electric potential distribution relative to the distance from the cell side to the end portion side of the substrate in the semiconductor device of FIG. 2. FIG. 6 is a diagram which particularly demonstrates a comparison between the region on the cell side where the widths of the first conductors as well as the second conductors are large and the region on the end portion side of the substrate where the widths of the first conductors as well as the second conductors are small. As plotted in FIG. 6, the electric potential varies gently in a region where the first conductors and the second conductors have the large widths. On the other hand, it is apparent that the electric potential varies sharply in a region where the first conductors and the second conductors have the small widths and then varies gently on the end portion side of the substrate, and that an inclination near the center in FIG. 6 (a part of the region of the small widths close to the large-width side) has a larger inclination than that on the left side in FIG. 6 representing the cell side. In other words, it is apparent that the inclination of the electric potential on the cell side is reduced by increasing the widths of the first conductors so as to decrease the likelihood of the concentration of sodium ions and the like on the cell side in the termination region. In the meantime, the inclination of the electric potential near the center in FIG. 6 is preferably set about six times (three to eight times for example) as large as the inclination of the electric potential on the end portion side of the substrate illustrated on the right side in FIG. 6. In this way, sodium ions and the like are even less likely to gather on the cell side in the termination region.

Other Embodiments

While the embodiments of the disclosure have been described above, it is not to be understood that the statements and the drawings constituting part of this disclosure are intended to limit this disclosure. Various alternative embodiments, examples, and operation techniques become obvious to those skilled in the art from this disclosure. In this context, the disclosure encompasses various other embodiments not expressly described herein. Accordingly, the technical scope of this disclosure is to be defined solely by the matters specifying the disclosure concerning the appended claims that are reasonable from the above description.

The semiconductor device disclosed in Patent Document 1 may allow penetration of ionic substances and the like to the inside of a substance from the outside. The penetration of the ionic substances and the like may cause a malfunction or a failure of the semiconductor device and occasionally reduce reliability of the semiconductor device.

According one or more embodiments described above, the semiconductor according to one or more embodiments described above can improve reliability.

The invention claimed is:

1. A semiconductor device including a cell region and a termination region arranged around the cell region, comprising:
   a substrate;
   a first semiconductor region of a first conductivity type arranged in the cell region on a first surface side of the substrate;
   a second semiconductor region of a second conductivity type arranged in the cell region on the first surface side of the substrate;
   a channel stopper electrode arranged in the termination region on the first surface side of the substrate;
   a first electrode arranged on the first surface of the substrate and electrically connected to the second semiconductor region;
   a first interlayer insulation film arranged between the channel stopper electrode and the first electrode in the termination region of the substrate;
   first conductors arranged inside the first interlayer insulation film;
   second conductors arranged on the first interlayer insulation film; and
   a second electrode arranged on a second surface side of the substrate, wherein
   a width of an overlapping portion, in a height direction by which one of the first conductors is overlapped by one of the second conductors on the first electrode side is larger than a width of an overlapping portion, in the height direction by which one of the first conductors is overlapped by one of the second conductors on the channel stopper electrode side.

2. The semiconductor device according to claim 1, wherein
   a dimension in the height direction of the first interlayer insulation film between the substrate and the first conductors is larger than a dimension in the height direction of the first interlayer insulation film between the first conductors and the second conductors.

3. The semiconductor device according to claim 1, further comprising:
   a reduced surface layer of the second conductivity type arranged in the termination region on the first surface side of the substrate, electrically connected to the second semiconductor region, and having a lower impurity concentration than an impurity concentration of the first semiconductor region, wherein
   dimensions in a longitudinal direction of the second conductors at a section above the reduced surface layer are gradually reduced from the second conductor electrically connected to the first electrode to the channel stopper electrode side.

4. The semiconductor device according to claim 3, wherein
 dimensions in a longitudinal direction of the first conductors at a section above the reduced surface layer are gradually reduced from the first conductor arranged in the vicinity of the first electrode to the channel stopper electrode side.

5. The semiconductor device according to claim 3, wherein
 at least one of the second conductors is electrically connected to the first electrode,
 at least one of the second conductors is electrically connected to the channel stopper electrode, and
 a dimension of the second conductor electrically connected to the first electrode is longer than a dimension of the second conductor electrically connected to the channel stopper electrode.

6. The semiconductor device according to claim 3, wherein
 the widths of the overlapping portions in the height direction of the first conductors and the second conductors at the section above the reduced surface layer are gradually reduced from the first conductor arranged close to the first electrode to an end portion of the reduced surface layer.

7. The semiconductor device according to claim 6, wherein
 the widths of the overlapping portions in the height direction of the first conductors and the second conductors outside the section above the reduced surface are substantially equal to one another.

8. The semiconductor device according to claim 1, wherein an end portion of the second conductor electrically connected to the first electrode is positioned farther away from the cell region than an end portion of the first electrode is.

9. The semiconductor device according to claim 1, wherein
 the first conductors comprise p-type polycrystalline silicon as a main component, and
 the second conductors comprise n-type polycrystalline silicon as a main component.

10. The semiconductor device according to claim 9, wherein
 an impurity concentration of the first conductors is higher than an impurity concentration of the second conductors.

11. The semiconductor device according to claim 1, further comprising:
 a second interlayer insulation film arranged on a channel stopper region and covered with the channel stopper electrode, wherein
 the channel stopper electrode and the second conductor electrically connected to the channel stopper electrode are in contact with each other through a conductor between the first interlayer insulation film and the second interlayer insulation film.

12. The semiconductor device according to claim 1, further comprising:
 a third interlayer insulation film arranged on the second semiconductor region and covered with the first electrode, wherein
 the first electrode and the first conductor arranged close to the first electrode are in contact with each other through a conductor between the first interlayer insulation film and the third interlayer insulation film.

13. A semiconductor device including a cell region and a termination region arranged around the cell region, comprising:
 a substrate;
 a first semiconductor region of a first conductivity type arranged in the cell region on a first surface side of the substrate;
 a second semiconductor region of a second conductivity type arranged in the cell region on the first surface side of the substrate;
 a channel stopper electrode arranged in the termination region on the first surface side of the substrate;
 a first electrode arranged on the first surface of the substrate and electrically connected to the second semiconductor region;
 a first interlayer insulation film arranged between the channel stopper electrode and the first electrode in the termination region of the substrate;
 first conductors arranged inside the first interlayer insulation film;
 second conductors arranged on the first interlayer insulation film;
 a second electrode arranged on a second surface side of the substrate, and
 a second interlayer insulation film arranged on a channel stopper region and covered with the channel stopper electrode, wherein
 a width of an overlapping portion, in a height direction by which one of the first conductors is overlapped by one of the second conductors on the first electrode side is larger than a width of an overlapping portion, in the height direction by which one of the first conductors is overlapped by one of the second conductors on the channel stopper electrode side, and
 the channel stopper electrode and the second conductor electrically connected to the channel stopper electrode are in contact with each other through a conductor between the first interlayer insulation film and the second interlayer insulation film.

14. A semiconductor device including a cell region and a termination region arranged around the cell region, comprising:
 a substrate;
 a first semiconductor region of a first conductivity type arranged in the cell region on a first surface side of the substrate;
 a second semiconductor region of a second conductivity type arranged in the cell region on the first surface side of the substrate;
 a channel stopper electrode arranged in the termination region on the first surface side of the substrate;
 a first electrode arranged on the first surface of the substrate and electrically connected to the second semiconductor region;
 a first interlayer insulation film arranged between the channel stopper electrode and the first electrode in the termination region of the substrate;
 first conductors arranged inside the first interlayer insulation film;
 second conductors arranged on the first interlayer insulation film;
 a second electrode arranged on a second surface side of the substrate, and
 a third interlayer insulation film arranged on the second semiconductor region and covered with the first electrode, wherein a width of an overlapping portion, in a height direction by which one of the first conductors is overlapped by one of the second conductors on the first electrode side is larger than a width of an overlapping portion, in the height direction by which one of the first conductors is overlapped by one of the second conductors on the channel stopper electrode side, and the first electrode and the first conductor arranged close to the first electrode are in contact with each other through a conductor between the first interlayer insulation film and the third interlayer insulation film.

\* \* \* \* \*